US011031922B1

(12) United States Patent
Young

(10) Patent No.: US 11,031,922 B1
(45) Date of Patent: Jun. 8, 2021

(54) SWITCH CIRCUIT WITH REDUCED SWITCH NODE RINGING

(71) Applicant: Alpha and Omega Semiconductor (Cayman) Limited, Grand Cayman (KY)

(72) Inventor: Chris M. Young, Round Rock, TX (US)

(73) Assignee: Alpha and Omega Semiconductor (Cayman) Limited, Grand Cayman (KY)

( * ) Notice: Subject to any disclaimer, the term of this patent is extended or adjusted under 35 U.S.C. 154(b) by 0 days.

(21) Appl. No.: 16/702,247

(22) Filed: Dec. 3, 2019

(51) Int. Cl.
*H03K 3/012* (2006.01)
*H03K 3/017* (2006.01)
*H03K 17/687* (2006.01)

(52) U.S. Cl.
CPC ............ *H03K 3/012* (2013.01); *H03K 3/017* (2013.01); *H03K 17/687* (2013.01); *H03K 2217/0063* (2013.01); *H03K 2217/0072* (2013.01)

(58) Field of Classification Search
CPC .......... H03K 3/01; H03K 3/012; H03K 3/017; H03K 17/51; H03K 17/56; H03K 17/687; H03K 17/6871; H03K 2217/0063; H03K 2217/0072
USPC .................................................. 327/108–112
See application file for complete search history.

(56) References Cited

U.S. PATENT DOCUMENTS

| | | | | |
|---|---|---|---|---|
| 6,144,245 A * | 11/2000 | Balogh | .............. | H03K 17/0822 323/282 |
| 8,946,942 B2 | 2/2015 | Lui et al. | | |
| 9,379,597 B2 * | 6/2016 | Shinohara | ............... | H02P 25/22 |
| 9,548,729 B2 * | 1/2017 | Miyamae | ............... | H03K 17/04 |
| 10,103,140 B2 | 10/2018 | Pan et al. | | |
| 10,418,899 B2 | 9/2019 | Lui et al. | | |
| 2018/0316345 A1 * | 11/2018 | Kwak | ................ | H03K 17/6872 |
| 2020/0177090 A1 * | 6/2020 | Braz | ................ | H03K 17/08122 |

OTHER PUBLICATIONS

Harry C. P. Dymond, Jianjing Wang, Dawei Liu, Jeremy J. O. Dalton, Neville Mcneill, Dinesh Pamunuwa, Simon J. Hollis, and Bernard H. Stark, A 6.7-GHz Active Gate Driver for GaN FETs to Combat Overshoot, Ringing, and EMI, IEEE Transactions on Power Electronics, vol. 33, No. 1, Jan. 2018, 14 pages.

* cited by examiner

*Primary Examiner* — Diana J. Cheng
(74) *Attorney, Agent, or Firm* — Craige Thompson; Thompson Patent Law

(57) ABSTRACT

Apparatus and associated methods relate to providing a power stage having an auxiliary power switch coupled to a high-side switch or a low-side switch in parallel and turning on the auxiliary power switch earlier than turning on the high-side switch. In an illustrative example, the auxiliary power switch may be connected with the high-side switch in parallel. The on-resistance of the auxiliary power switch may be greater than the on-resistance of the high-side switch. A gate drive engine may be configured to generate gate driving signals for the switches in the power stage such that the auxiliary power switch is turned on a predetermined time duration earlier than the high-side switch. Thus, the ringing at a switch node of the power stage may be advantageously reduced or eliminated.

20 Claims, 9 Drawing Sheets

SWITCH CIRCUIT WITH REDUCED SWITCH NODE RINGING

TECHNICAL FIELD

Various embodiments relate generally to switch circuits.

BACKGROUND

Electronic devices, which may also be referred to as loads, receive power from a variety of electrical power sources. For example, some power sources may be coupled to a load device at a wall outlet (e.g., from a mains source) or may couple more directly to various local and/or portable sources (e.g., batteries, renewable energy sources, generators). Some load devices, such as central processing units (CPU) and graphics processors (GPU) continue to develop higher input current requirements while demanding tight voltage regulation and/or high efficiency from the power source.

In some electronic devices, the source voltage supply (e.g., battery input, rectified mains supply, intermediate DC supply) may be converted to a load compatible voltage by various voltage conversion circuits. Switch-mode power supplies have gained popularity as voltage conversion circuits due to their high efficiency and therefore are often used to supply a variety of electronic loads.

Switch-mode power supplies convert voltages using switching devices that turn on with very low resistance and turn off with very high resistance. Switch-mode power supplies may charge an output inductor during a period of time and may release part or all of the inductor energy during a subsequent period of time. The output energy may be delivered to a bank of output capacitors, which provide the filtering to produce a DC output voltage. In buck-derived switch-mode power supplies, the output voltage, in a steady state, may be approximately the input voltage times a duty cycle, where the duty cycle is the duration of the on-time of a pass switch divided by the total on-time and off-time of the pass switch for one switching cycle.

SUMMARY

Apparatus and associated methods relate to providing a power stage having an auxiliary power switch in parallel with one of a high-side switch or a low-side switch in the power stage and turning on the auxiliary power switch a predetermined time before than turning on the high-side switch. In an illustrative example, the auxiliary power switch may be connected with the high-side switch in parallel. The on-resistance of the auxiliary power switch may be greater than the on-resistance of the high-side switch. A gate drive engine may be configured to generate gate driving signals for the switches in the power stage such that the auxiliary power switch may be turned on a predetermined time duration earlier than the high-side switch. Thus, the ringing at a switch node of the power stage may be advantageously reduced or eliminated.

Various embodiments may achieve one or more advantages. For example, some embodiments may reduce or eliminate the ringing at the switch node such that the oscillation voltage applied to the switches in the power stage and the load may be reduced, which may advantageously improve the reliability of the switches in the power stage and the load. For example, the switches may be protected from breakdown. In addition, as the ringing at the switch node is reduced, the power dissipated during by the ringing may also be reduced, which may advantageously improve the power efficiency of the power stage. The electromagnetic interference generated by the ringing may also be reduced.

In some embodiments, after the high-side switch is turned on, the auxiliary power switch may be turned off before a trailing edge of a pulse-modulated-width (PWM) signal to reduce the power consumed by the auxiliary power switch to further improve thermal performance of the auxiliary power switch. In some embodiments, each switch in the power stage may be driven with a high current by a corresponding gate driver without introducing excessing ringing in the power stage.

In some embodiments, a leading edge blanking circuit may be used to blank a leading edge of the PWM signal to make the auxiliary switch be turned on earlier than the high-side switch. As the leading edge blanking circuit is arranged before a corresponding gate driver, the turn-on speed of the power stage may be kept high, and the switching frequency may not be affected. In some embodiments, the switches used in the power stage may be, for example, FinFETs, lateral MOSFETs, vertical MOSFETs (e.g., trench MOSFETs), and/or BJTs. Gate drivers used to drive the switches may be integrated with the switches to reduce the area consumed by the power stage.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary switch circuit having a power stage with reduced ringing implemented in a voltage regulator and an exemplary implementation in a representative computing product is briefly introduced with reference to FIG. 1. Second, with reference to FIG. 2, the discussion turns to two exemplary PWM signals with different leading edges used by gate drivers and power stages. Then, with reference to FIGS. 3-4, exemplary methods to implement and operate the switch circuit are discussed. With reference to FIGS. 5-6C, exemplary simulations are performed to show different ringing of different power stages. Then, with reference to FIGS. 7A-7B, other exemplary architectures for a gate drive engine used in the switch circuit are discussed. Finally, with reference to FIGS. 8A-8B, the discussion turns to exemplary embodiments that illustrate the architecture of another switch circuit used in the voltage regulator and corresponding simulation results.

DC-to-DC voltage conversion is often performed by switch-mode voltage regulators, also referred to as voltage converters or point-of-load (POL) regulators/converters. One type of DC-to-DC converter, called a buck or step-down regulator, may convert a higher voltage (e.g., 12V) to a lower value as required by one or more load devices. More generally, voltage regulators and current regulators are commonly referred to as power converters, and as used herein, the term power converter is meant to encompass such devices.

Figure 1:
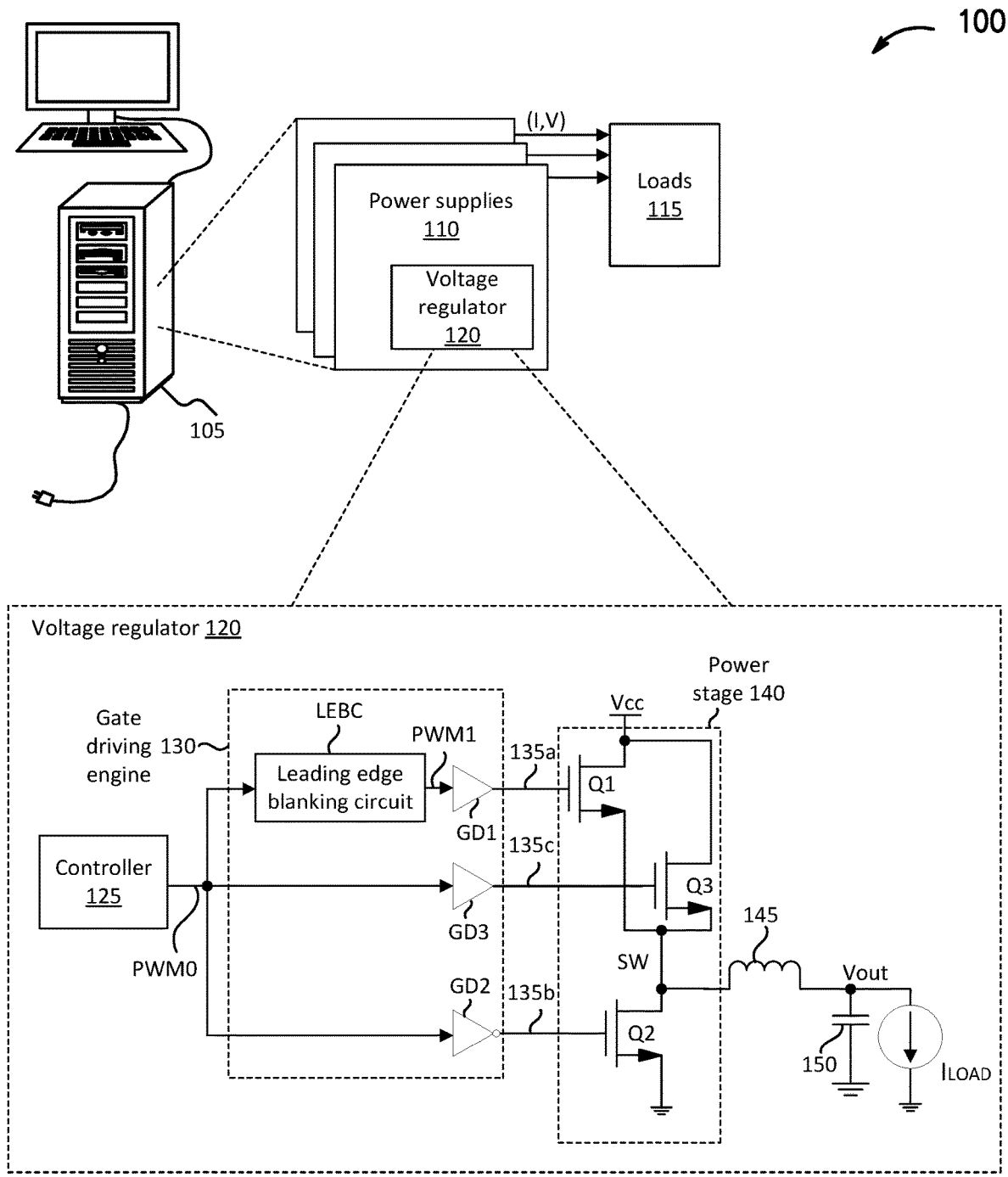
FIG. 1 depicts an exemplary switch circuit with low switch node ringing implemented in an exemplary voltage regulator.

FIG. 1 depicts an exemplary switch circuit with low switch node ringing implemented in an exemplary voltage regulator. In this depicted example, system 100 includes a powered load system 105 (e.g., computer). The powered load system 105 includes one or more interleaved power supplies 110 implemented in the computer 105 supplying one or more loads 115. The load 115 may include one or more components of a computing system (e.g., core rail of a processor). In some examples, the loads 115 may be specified to operate at a voltage with limited voltage perturbations. The power supplies 110 include a voltage regulator 120. The voltage regulator 120 regulates currents or voltages supplied into the loads 115. In this depicted example, the voltage regulator 120 includes a voltage regulator controller 125 configured to cause the voltage regulator 120 to produce regulated output voltages $V_{out}$. The voltage regulator controller 125 is configured to generate and dynamically modulate the frequency of a pulse-width-modulated (PWM) signal to achieve a fast transient response. More specifically, the voltage regulator 120 includes a gate driver engine 130 configured to receive an original PWM signal (PWM0) and generate drive signals (e.g., drive signals 135a, 135b, 135c) to drive a switched-mode power stage 140. The switched-mode power stage 140 includes a second high-side transistor that may be turned on earlier than a first high-side transistor to advantageously reduce or eliminate ringing at the switch node of the power stage 140.

More specifically, the power stage 140, in this depicted example, includes a first high-side switch (e.g., a MOSFET) Q1 and a low-side switch Q2. In this depicted example, both the high-side switch Q1 and the low-side switch Q2 are N-type metal-oxide-semiconductor field-effect-transistors (NMOSFETs). The drain of the high-side switch Q1 is coupled to receive a predetermined power $V_{CC}$, and the source of the high-side switch Q1 is coupled to an intermediate switch node SW. The drain of the low-side switch Q2 is coupled to the intermediate switch node SW, and the source of the low-side switch Q2 is coupled to a reference voltage level (e.g., GND). The low-side switch Q2 may be a synchronous rectifier, for example.

The power stage 140 also includes a second high-side switch (e.g., a MOSFET) Q3 (e.g., auxiliary switch). In this depicted example, the second high-side switch Q3 is also an NMOSFET. The drain of the second high-side switch Q3 is coupled to the drain of the first high-side switch Q1, and the source of the high-side switch Q3 is coupled to the intermediate switch node SW. The on-resistance (e.g., 1 ohm) of Q3 may be greater than the on-resistance (e.g., 5 mohm) of Q1 to pull the switch node up to the input voltage with reduced or eliminated ringing. In another example, the auxiliary switch Q3 may be coupled to the low-side switch Q2 in parallel. An exemplary architecture of this switch circuit is discussed with reference to FIG. 8A.

The gate terminals of Q1, Q2, and Q3 are driven by a corresponding drive signal 135a, 135, and 135c generated by a corresponding gate driver GD1, GD2, and GD3, respectively. The three gate drivers GD1, GD2, and GD3 are used to precisely control relative timing of the turning on and off of the respective switches in a predetermined fashion. In response to different drive signals, during low side to high side transition, the second high-side switch Q3 is configured to be turned on earlier than the first high-side switch Q1, and after a suitable time, the first high-side switch Q1 may be turned on for the rest duration of the PWM pulse such that the ringing at the switch node SW may be substantially reduced or eliminated. A transistor may be being regarded as "turned on" when it goes from a high resistance state to a low resistance stage due to the action of the gate voltage in the case of a MOSFET. Accordingly, overvoltage (e.g., breakdown) damage to power switches may be reduced.

In this depicted example, turning on the second high-side switch Q3 earlier than the first high-side switch Q1 is achieved by providing a leading edge blanking circuit LEBC in the gate drive engine 130. The LEBC is configured to receive the original PWM signal PWM0 and blank the leading edge of the original PWM signal PWM0. The leading edge blanked PWM signal PWM1 is received by the first gate driver GD1 to generate the first drive signal 135a for the first high-side switch Q1. Exemplary original PWM signal PWM0 and a leading edge blanking PWM signal PWM1 are shown with reference to FIG. 2.

In some embodiments, the leading edge blanking circuit LEBC may be an analog circuit or a digital circuit (e.g., having a counter that increments periodically). In some embodiments, the leading edge blanking circuit may also include a state machine configured to sense a voltage at the switch node on a cycle by cycle basis and turn on the first high-side switch Q1 (e.g., the rising point of the delayed PWM signal's leading edge) when the sensed voltage is no less than a predetermined voltage value (e.g., the input voltage). In some embodiments, the high-side switch Q1 may be turned on after the second high-side switch Q3 has been turned on for a fixed predetermined time (e.g., 1 ns). For example, fuses may be used. Other exemplary embodiments (discussed in further detail with reference to FIGS. 7A-7B) may be possible to generate different gate drive signals to make the auxiliary transistor Q3 be turned on earlier than the first high-side transistor Q1.

In some embodiments, the threshold voltage of the second high-side switch Q3 may be smaller than the threshold voltage of the first high-side switch Q1 such that the second high-side switch Q3 may be turned on earlier than the first high-side switch Q1. In some embodiments, the on-resistance of the second high-side switch Q3 may be designed to have an appropriate resistance (and independent from the on-resistance of the first high-side switch Q1). For example, when the on-resistance of the high-side switch Q3 is too small, the ringing at the switch node may not be significantly reduced. When the on-resistance of the high-side switch Q3 is too large, the voltage at the switch node may never reach to the input voltage.

In some embodiments, the size of the second high-side switch Q3 may be smaller than the size of the first high-side switch Q1. For example, the size of the second high-side switch Q3 may be a few percent of the size of the first high-side switch Q1. In some embodiments, switch Q1, Q2, and/or Q3 may be vertical field-effect-transistors (e.g., trench MOSFETs) or lateral FETs. Part or all of the gate drive engine 130 may be integrated with the switch Q1, Q2, and/or Q3.

The voltage regulator 120 also includes an inductor 145 with one terminal of the inductor 145 is coupled to the output of the switched-mode power stage 140. The voltage regulator 120 also includes a capacitor 150 coupled to the other terminal of the inductor 145 through an output node. An output voltage $V_{OUT}$ at the output node is then received by the loads 115.

Figure 2:
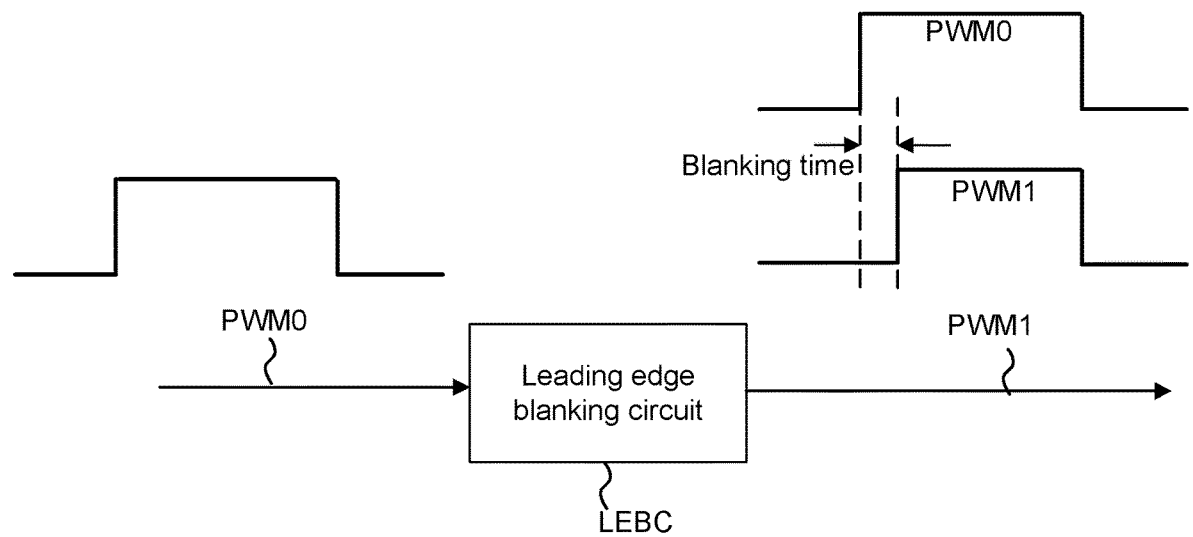
FIG. 2 depicts exemplary timing diagrams of pulse-width-modulated (PWM) signals used in the switch circuit.

FIG. 2 depicts exemplary pulse-width-modulated (PWM) signals used in the switch circuit. As shown in FIG. 2, an original PWM signal PWM0 is received by the LEBC. The LEBC generates a processed PWM signal PWM1 with its leading edge blanked for a predetermined time duration. The predetermined time duration may be generated by a delay line, for example. The original PWM PWM0 signal is received by the third gate driver GD3, and the processed PWM signal PWM1 is then received by the first gate driver GD1. Thus, the second high-side transistor Q3 may be turned on earlier than the first high-side transistor Q1 to advantageously reduce or eliminate ringing at the switch node.

In this depicted example, both the first high-side switch Q1 and the second high-side switch Q3 are turned off at the end of the PWM pulse. In some embodiments, the second high-side switch Q3 may be turned off earlier than the end of the PWM pulse to reduce the power dissipation. For example, the second high-side switch Q3 may be turned off when the first high-side switch Q1 is turned on.

Figure 3:
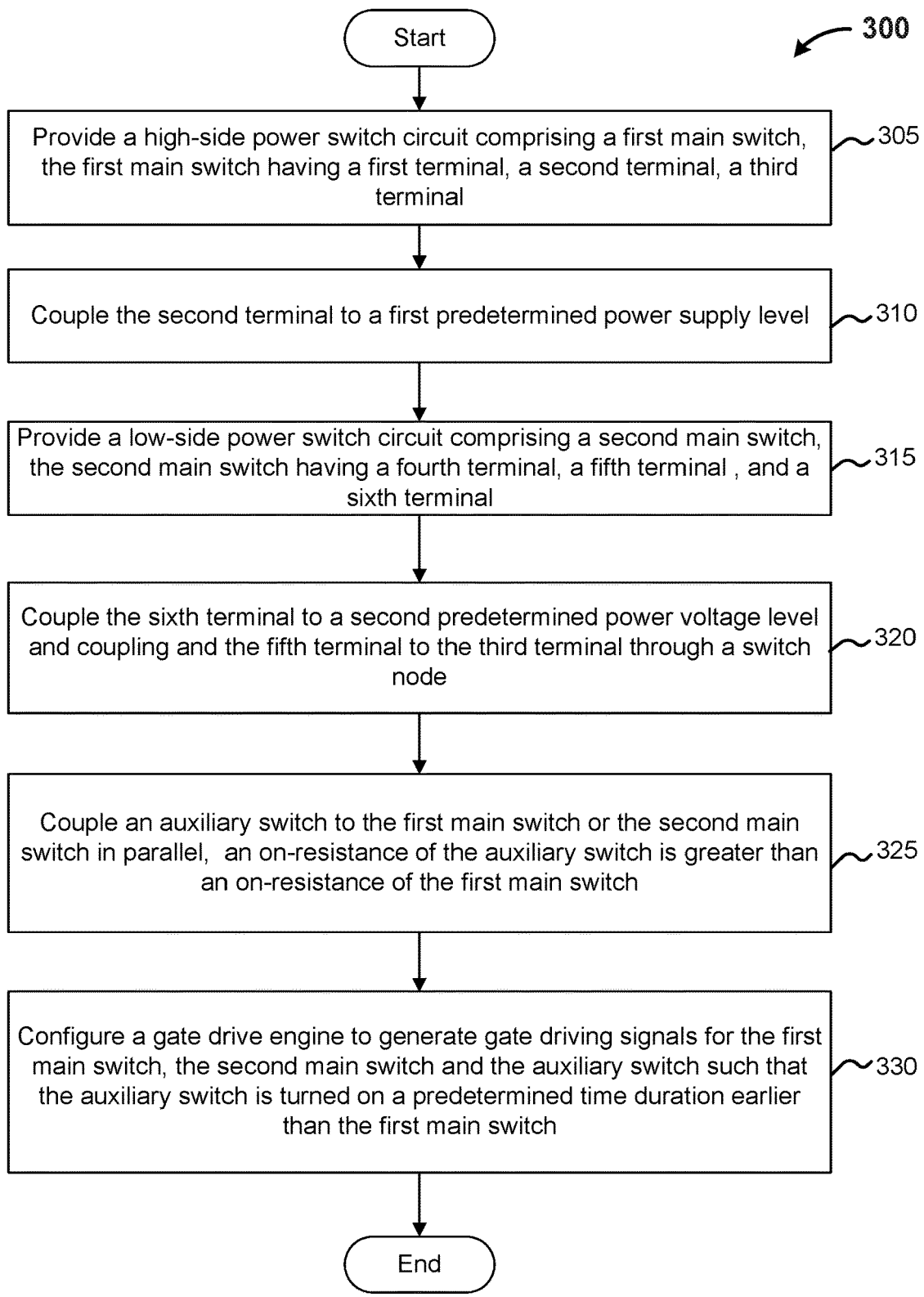
FIG. 3 depicts a flow chart of an exemplary method to implement the switch circuit.

FIG. 3 depicts a flow chart of an exemplary method to implement the switch circuit. An exemplary method 300 to implement the switch circuit depicted in FIG. 1 includes, at 305, providing a high-side power switch circuit having a first main switch (e.g., Q1), the first main switch having a first terminal (e.g., gate terminal of Q1), a second terminal (e.g., drain terminal of Q1), a third terminal (e.g., source terminal of Q1). The method 300 also includes, at 310, coupling the second terminal to a first predetermined power supply level (e.g., $V_{CC}$).

The method 300 also includes, at 315, providing a low-side power switch circuit having a second main switch (e.g., Q2), the second main switch having a fourth terminal (e.g., gate terminal of Q2), a fifth terminal (e.g., drain terminal of Q2), and a sixth terminal (e.g., source terminal of Q2). The method 300 also includes, at 320, coupling the sixth terminal to a second predetermined power voltage level (e.g., GND) and coupling and the fifth terminal to the third terminal through a switch node (e.g., SW node). The method 300 also includes, at 325, coupling an auxiliary switch (e.g., Q3) to the first main switch or the second main switch in parallel, and an on-resistance of the auxiliary switch is greater than an on-resistance of the first main switch Q1.

The method 300 also includes, at 330, configuring a gate drive engine (e.g., gate drive engine 130) to generate gate driving signals (e.g., 135a-135c) for the first main switch Q1, the second main switch Q2 and the auxiliary switch Q3 such that the auxiliary switch Q3 is turned on a predetermined time duration (e.g., blanking time) earlier than the first main switch Q1. Accordingly, ringing at the switch node may be advantageously reduced or eliminated to improve the reliability of the power switches.

Figure 4:
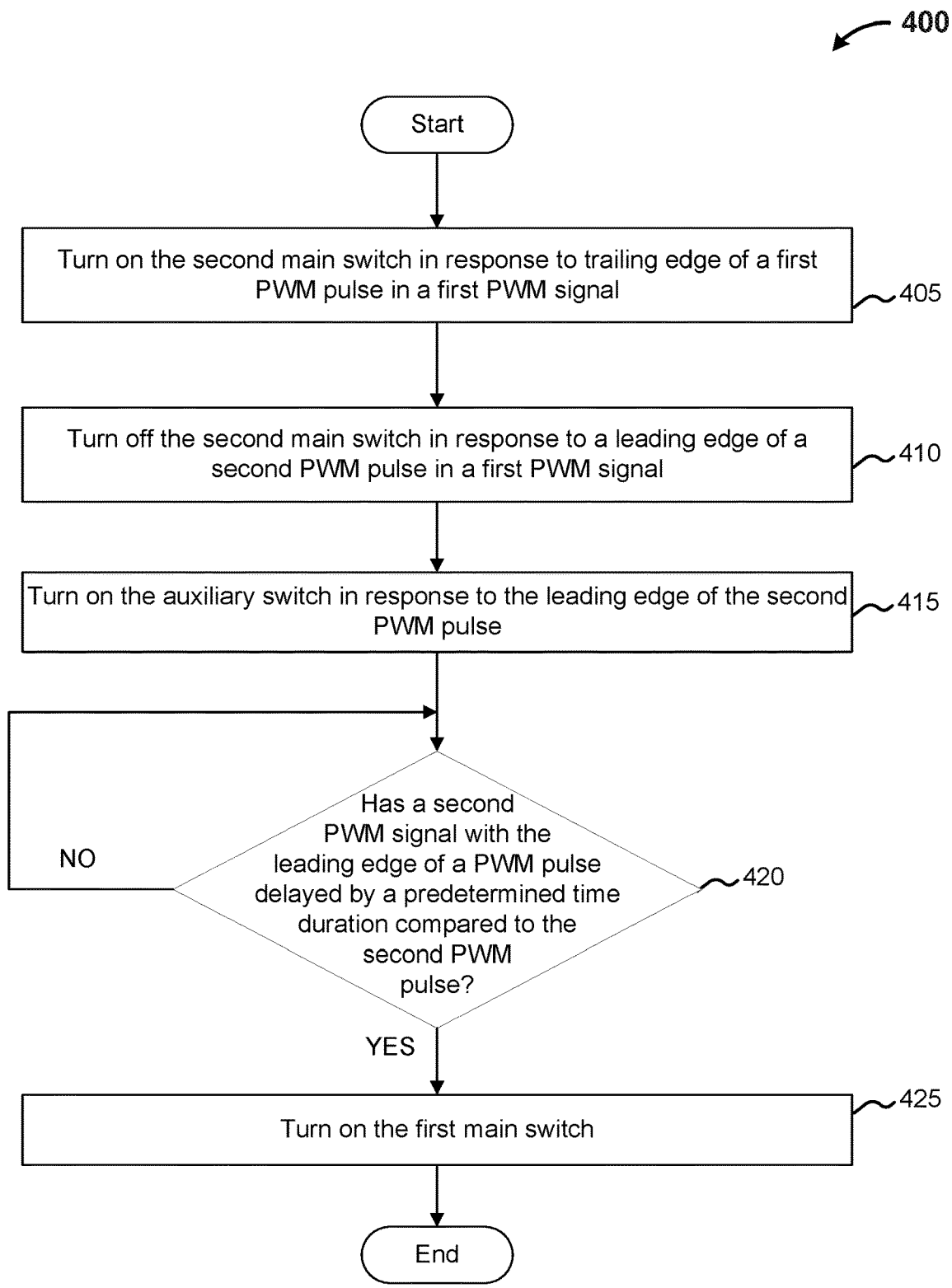
FIG. 4 depicts a flow chart of an exemplary method to operate the switch circuit.
Figure 5:
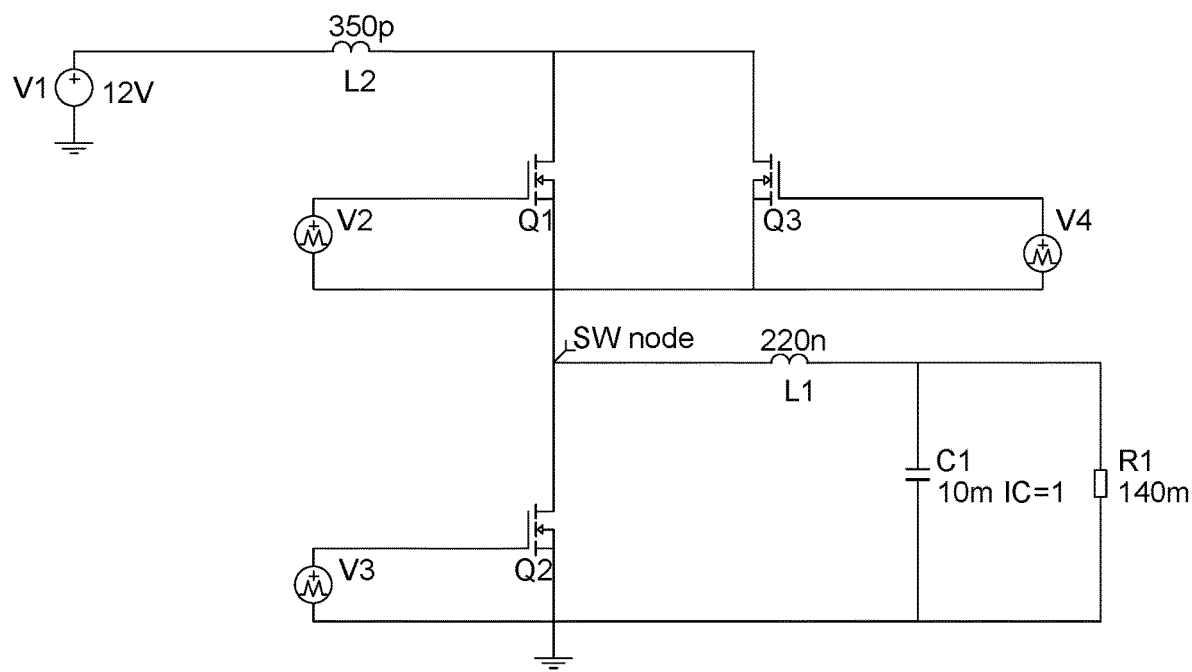
FIG. 5 depicts an exemplary synchronous buck circuit model used for simulation.

FIG. 4 depicts a flow chart of an exemplary method to operate the switch circuit. An exemplary method 400 to operate the switch circuit includes, at 405, in response to a trailing edge of a first PWM pulse of a first PWM signal PWM0, turning on the low-side transistor Q2. The method 400 also includes, at 410, turning off the low-side transistor Q2 in response to a leading edge of a second PWM pulse of the first PWM signal PWM0. The method 400 also includes, at 415, turning on the second high-side transistor Q3 in response to the leading edge of the first PWM pulse. The method 400 also includes, at 420, determining whether the leading edge of a PWM pulse (e.g., the leading edge blacking PWM pulse in the processed PWM signal) in a second PWM signal PWM1 to be received by the first high-side transistor Q1 has been blanked for a predetermined time duration. If the leading edge of the PWM pulse in the second PWM signal PWM1 has not been blanked for the predetermined time duration, then, the method loops back to 420 to keep monitoring the blanking situation, and if the leading edge of the PWM pulse in the second PWM signal PWM1 has been blanked for the predetermined time duration (e.g., a processed/second PWM signal PWM1 has been generated), then, the method 400 includes, at 425, turning on the first high-side transistor Q1 in response to a leading edge of the PWM pulse in the second PWM signal PWM1. Thus, the second high-side transistor Q3 is turned on earlier than the first high-side transistor Q1. Accordingly, the ringing at the switch node may be advantageously reduced or eliminated.

FIG. 5 depicts an exemplary synchronous buck circuit model used for simulation. In this depicted example, a synchronous buck circuit model is provided. Exemplary parasitic inductance (e.g., L1) is included in this model. Exemplary values of the capacitor, the inductor, and the load are assigned to perform the simulation. The input voltage $V_{CC}$ (e.g., V1) is selected as 12V.

Figure 6A:
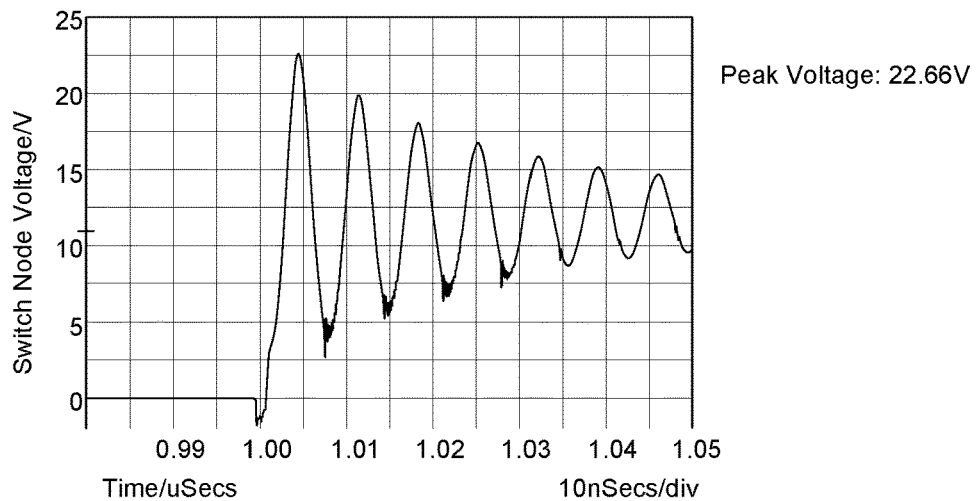
FIGS. 6A-6C depict different simulation results of the switch node voltages in the synchronous buck circuit model discussed with reference to FIG. 5.
Figure 6B:
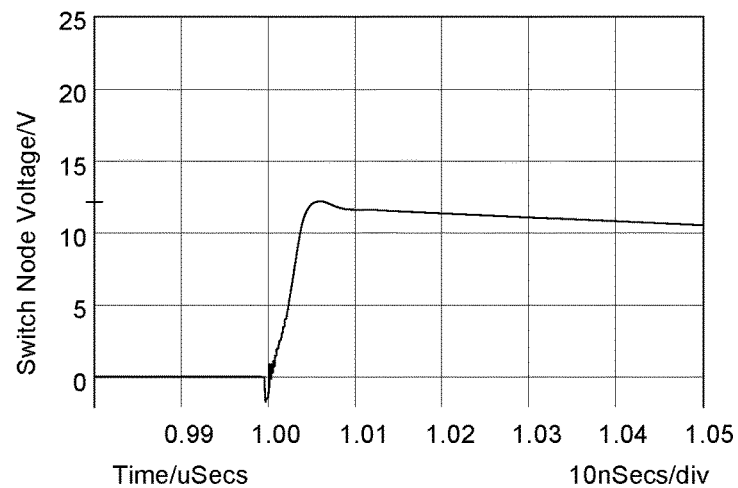
Figure 6C:
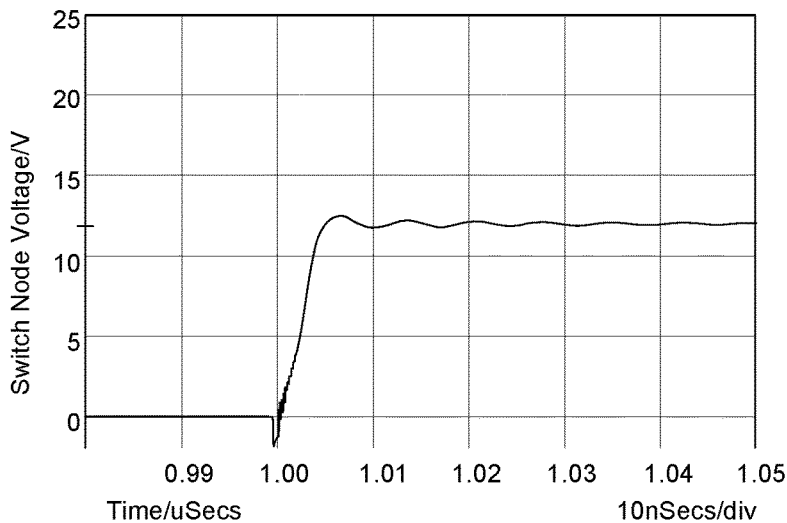

FIGS. 6A-6C depict different simulation results of the switch node voltages in the synchronous buck circuit model discussed with reference to FIG. 5. FIG. 6A depicts the switch node voltage of a power stage without the auxiliary transistor Q3. As shown in FIG. 6A, the oscillation amplitude at the switch node may be as high as 22.66V (almost two times the input voltage $V_{CC}$), which may potentially damage the switches in the power stage. The negative switch node voltage, as shown in FIG. 6A, may be caused by the intrinsic body diode of the low-side switch Q2. FIG. 6B depicts the switch node voltage after turning on the second high-side transistor Q3. As the second high-side transistor Q3 has a larger on-resistance, the switch node voltage is pulled up the input voltage with reduced ringing. After a delay, the first high-side transistor Q1 is turned on. The switch node voltage is shown in FIG. 6C. Compared to the switch node voltage shown in FIG. 6A, the power stage having the second high-side transistor Q3 generates the switch node voltage with little ringing while allows a fast turn-on speed.

Figure 7A:
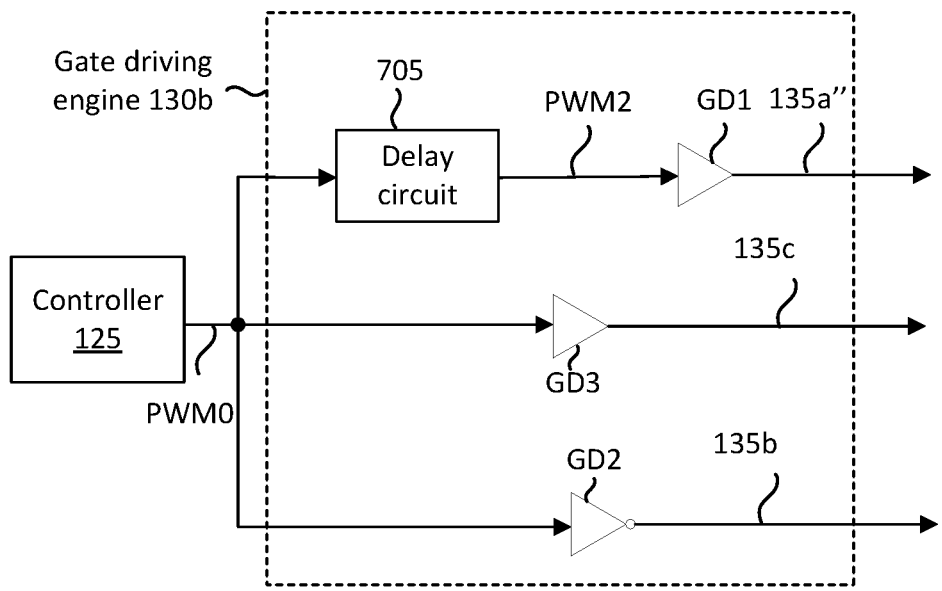
FIG. 7A depicts a second exemplary architecture of the gate drive engine.

FIG. 7A depicts a second exemplary architecture of the gate drive engine. In this depicted example, a gate driving engine 130b includes a delay circuit 705 configured to receive the original PWM signal PWM0 and apply a delay on the PWM0 to generate a delayed PWM signal PWM2. Accordingly, the leading edge of the original PWM signal PWM0 is earlier than the leading edge of the delayed PWM signal PWM2. The original PWM signal PWM0 is received by the third gate driver GD3 to generate the third gate drive signal 135*c*, and the delayed PWM signal PWM2 is received by the first gate driver GD1 to generate a new first gate drive signal 135*a*'. Thus, the second high-side transistor Q3 is turned on earlier than the first high-side transistor Q1. Accordingly, the ringing at the switch node may be advantageously reduced. In some embodiments, the delay circuit may be an analog circuit formed by delay lines. In some embodiments, the delay circuit may be a digital circuit formed by inverters, for example. In some embodiments, the delay circuit may be a hybrid delay circuit.

Figure 7B:
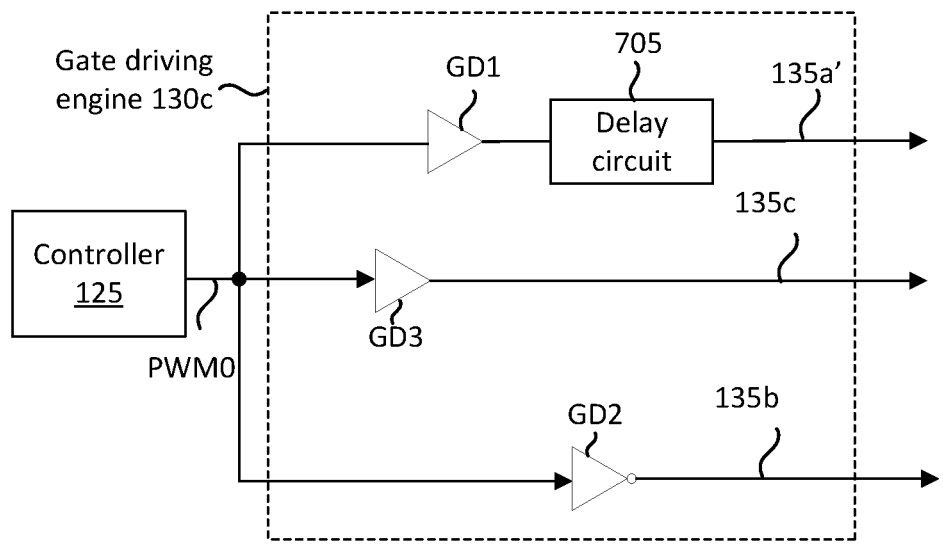
FIG. 7B depicts a third exemplary architecture of the gate drive engine.

FIG. 7B depicts a third exemplary architecture of the gate drive engine. In this depicted example, a gate driving engine also includes the delay circuit 705. The delay circuit 705 here is used to directly delay a gate driving signal generated by the first gate driver GD1. In this way, the second high-side transistor Q3 may also be turned on earlier than the first high-side transistor Q1. Accordingly, the ringing at the switch node may be advantageously reduced.

Figure 8A:
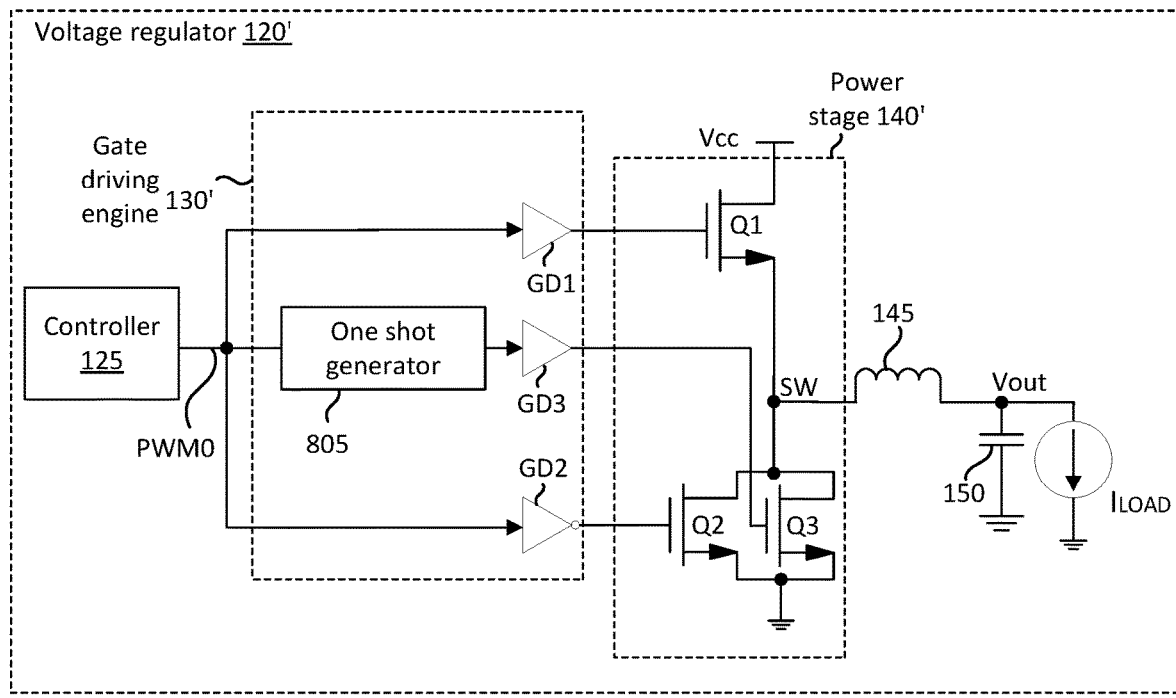
FIG. 8A depicts an architecture of another exemplary switch circuit with low switch node ringing.

FIG. 8A depicts an architecture of another exemplary switch circuit with low switch node ringing. In this depicted example, the auxiliary switch Q3 is connected in parallel with the low-side transistor Q2. The gate driving engine 130 generates the three gate driving signals 135*a*-135*c* to control the first high-side transistor Q1, the low-side transistor Q2, and the auxiliary switch Q3, respectively. The auxiliary switch Q3 may have a larger on-resistance than the first high-side transistor Q1. The auxiliary switch Q3 is turned on, for a short duration, starting at the same time as the first high-side transistor Q1 such that the ringing at the switching node of the power stage 140' is advantageously reduced. A one shot generator 805 is used to control the on time of Q3 such that the ringing at the switch node of the power stage may be controlled.

Figure 8B:
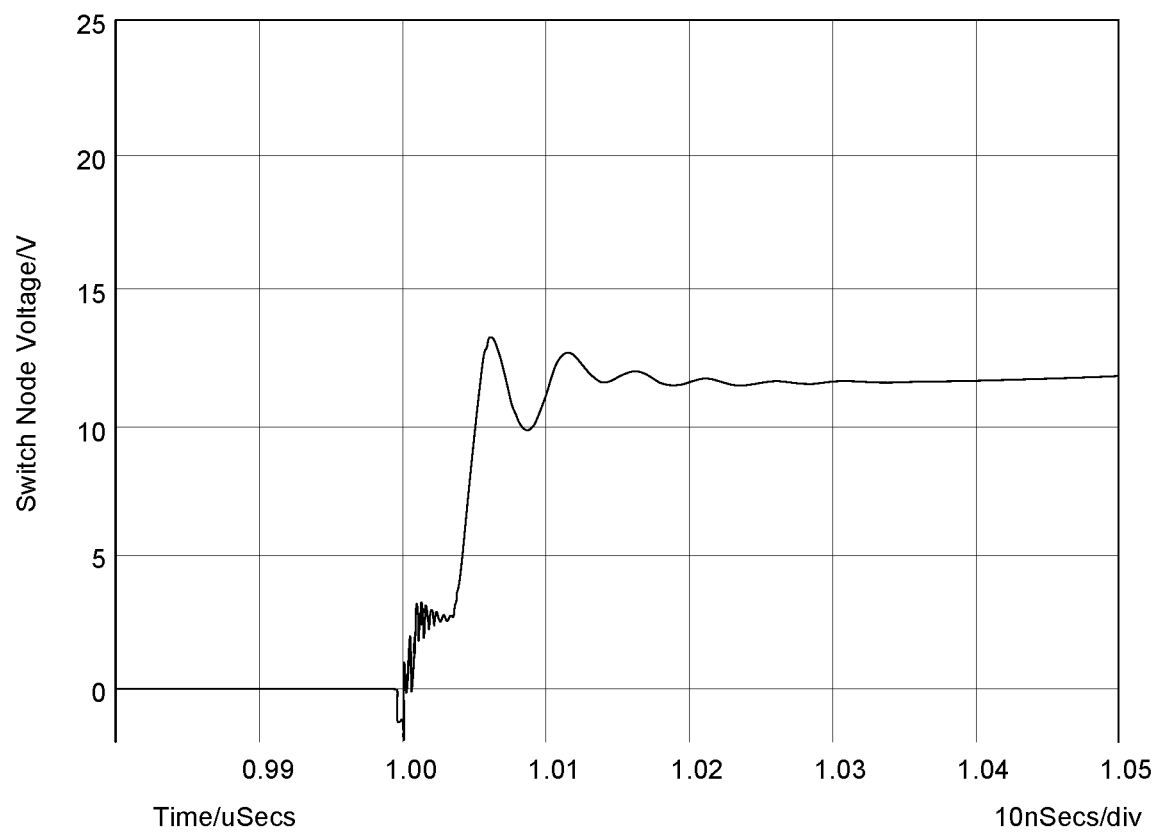
FIG. 8B depicts a simulation result of the switch node voltage in the switch circuit discussed with reference to FIG. 8A.

FIG. 8B depicts a simulation result of the switch node voltage in the switch circuit discussed with reference to FIG. 8A. A simulation environment similar to the simulation environment discussed with reference to FIG. 5 may be used to simulate the switch node voltage of the power stage 140'. As shown in FIG. 8B, when the auxiliary switch Q3 is in parallel with the low-side transistor Q2, the ringing at the switch node may also be advantageously reduced.

Although various embodiments have been described with reference to the figures, other embodiments are possible. For example, in some embodiments, instead of using the leading edge blanking circuit, the gate driving engine may include a PWM signal control circuit that used to receive the original PWM signal PWM0 and generate a PWM signal PWM' that has a leading edge earlier than the original PWM signal PWM0. The PWM signal PWM' may be then received by the third gate driver GD3 to generate a third gate driving circuit to turn on the second high-side transistor Q3 earlier than the first high-side transistor Q1.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve both hardware and software.

In one exemplary aspect, a switch circuit includes (a) a power stage. The power stage includes (a1) a high-side power switch circuit comprising a first main switch having a first terminal (gate terminal1), a second terminal (drain terminal), a third terminal (source terminal), the second terminal (drain terminal) is coupled to a first predetermined power supply level ($V_{CC}$), (a2) a low-side power switch circuit comprising a second main switch having a fourth terminal (gate terminal 2), a fifth terminal (drain terminal), and a sixth terminal (source terminal), the sixth terminal (source terminal) is coupled to a second predetermined power voltage level (GND), and the fifth terminal is coupled to the third terminal through a switch node. One of the high-side power switch circuit and the low-side power switch circuit also includes an auxiliary switch coupled to a corresponding main switch in the same power switch circuit in parallel, and an on-resistance of the auxiliary switch is greater than an on-resistance of the first main switch. The switch circuit includes (b) a gate drive engine configured to generate gate driving signals for the first main switch, the second main switch and the auxiliary switch such that the auxiliary switch is turned on a predetermined time duration earlier than the first main switch.

In some embodiments, the high-side power switch circuit may include the auxiliary switch, and the auxiliary switch may be in parallel with the first main switch. In some embodiments, the low-side power switch circuit may include the auxiliary switch and the auxiliary switch may be in parallel with the second main switch. In some embodiments, a threshold voltage of the auxiliary switch may be smaller than a threshold voltage of the first main switch.

In some embodiments, the gate drive engine may include (a) a leading edge blanking circuit configured to receive a first PWM signal and blank the leading edge of the first PWM signal to generate a second PWM signal, (b) a first driver configured to receive the second PWM signal to generate a corresponding gate driving signal for the first main switch, and, (c) a second driver and a third driver configured to receive the first PWM signal and generate corresponding gate driving signals for the auxiliary switch and the second main switch, respectively.

In some embodiments, the leading edge blanking circuit may include a counter that increments periodically. In some embodiments, the leading edge blanking circuit may include a sensing circuit configured to sense a voltage at the switch node and generate the second PWM signal to turn on the first main switch when the sensed voltage is no less than a predetermined voltage value.

In some embodiments, the gate drive engine may include a delay circuit configured to receive a first PWM signal and generate a predetermined delay on the leading edge of the first PWM signal to generate a third PWM signal, a first driver configured to receive the third PWM signal to generate a corresponding gate driving signal for the first main switch, and, a second driver and a third driver configured to receive the first PWM signal and generate corresponding gate driving signals for the auxiliary switch and the second main switch, respectively.

In some embodiments, the corresponding gate drive signals may be configured to turn on the first main switch a fixed predetermined time duration later than turning on the auxiliary switch. In some embodiments, the corresponding gate drive signals may be configured to turn off the first main switch and the auxiliary switch at the same time. In some embodiments, the corresponding gate drive signals may be configured to turn off the auxiliary switch earlier than turning off the first main switch.

In some embodiments, the size of the auxiliary switch may be smaller than the size of the first main switch. In some embodiments, the gate drive engine may include a first driver configured to receive a first PWM signal to generate a first gate driving signal for the first main switch, a second driver configured to receive the first PWM signal and generate a second gate driving signal for the second main switch, a one short generator configured to receive the first PWM signal, a second driver coupled to an output of the one short generator to generate a second PWM signal, and, a third driver configured to receive the second PWM signal and generate a third gate driving signal for the auxiliary switch to control the on time of the auxiliary switch.

In another exemplary aspect, a method includes (a) providing a high-side power switch circuit comprising a first main switch, the first main switch having a first terminal, a second terminal, a third terminal, (b) coupling the second terminal to a first predetermined power supply level, (c) providing a low-side power switch circuit comprising a second main switch, the second main switch having a fourth terminal, a fifth terminal, and a sixth terminal, (d) coupling the sixth terminal to a second predetermined power voltage level and coupling and the fifth terminal to the third terminal through a switch node, (e) coupling an auxiliary switch to the first main switch or the second main switch in parallel, wherein an on-resistance of the auxiliary switch is greater than an on-resistance of the first main switch, and, (f) configuring a gate drive engine to generate gate driving signals for the first main switch, the second main switch and the auxiliary switch such that the auxiliary switch is turned on a predetermined time duration earlier than the first main switch.

In some embodiments, the method may also include coupling the auxiliary switch to the first main switch in parallel. In some embodiments, the method may also include coupling the auxiliary switch to the second main switch in parallel. In some embodiments, a threshold voltage of the auxiliary switch may be smaller than a threshold voltage of the first main switch.

In some embodiments, configuring a gate drive engine may include (a) configuring a leading edge blanking circuit to receive a first PWM signal and blank the leading edge of the first PWM signal to generate a second PWM signal, (b) configuring a first driver to receive the second PWM signal to generate a corresponding gate driving signal for the first main switch, and, (c) configuring a second driver and a third driver to receive the first PWM signal and generate corresponding gate driving signals for the auxiliary switch and the second main switch, respectively.

In some embodiments, the leading edge blanking circuit may include a counter that increments periodically. In some embodiments, configuring a gate drive engine may include (a) configuring a delay circuit to receive a first PWM signal and generate a predetermined delay on the leading edge of the first PWM signal to generate a third PWM signal, (b) configuring a first driver to receive the third PWM signal to generate a corresponding gate driving signal for the first main switch, and, (c) configuring a second driver and a third driver to receive the first PWM signal and generate corresponding gate driving signals for the auxiliary switch and the second main switch, respectively.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A switch circuit comprising:
   (a) a power stage, comprising:
      (a1) a high-side power switch circuit comprising a first main switch having a first terminal, a second terminal, a third terminal, the second terminal is coupled to a first predetermined power supply level;
      (a2) a low-side power switch circuit comprising a second main switch having a fourth terminal, a fifth terminal, and a sixth terminal, the sixth terminal is coupled to a second predetermined power voltage level, and the fifth terminal is coupled to the third terminal through a switch node, wherein one of the high-side power switch circuit and the low-side power switch circuit further comprises an auxiliary switch coupled to a corresponding main switch in the same power switch circuit in direct parallel configuration, and an on-resistance of the auxiliary switch is greater than an on-resistance of the first main switch, and wherein the switch node is configured to supply current directly to a load through an inductor such that, in operation, all current through the inductor flows through at least one of: the high-side power switch circuit and the low-side power switch circuit; and (b) a gate drive engine configured to generate binary gate driving signals for the first main switch, the second main switch and the auxiliary switch such that the auxiliary switch is turned on a predetermined time duration earlier than the first main switch and the first main switch, the second main switch and the auxiliary switch operate in a saturated mode.

2. The switch circuit of claim 1, wherein the high-side power switch circuit further comprises the auxiliary switch, the auxiliary switch is in parallel with the first main switch.

3. The switch circuit of claim 1, wherein the low-side power switch circuit further comprises the auxiliary switch and the auxiliary switch is in parallel with the second main switch.

4. The switch circuit of claim 3, wherein the gate drive engine comprises:
a first driver configured to receive a first PWM signal to generate a first gate driving signal for the first main switch;
a second driver configured to receive the first PWM signal and generate a second gate driving signal for the second main switch;
a one shot generator configured to receive the first PWM signal and generate a second PWM signal; and,
a third driver configured to receive the second PWM signal and generate a third gate driving signal for the auxiliary switch to control the on time of the auxiliary switch.

5. The switch circuit of claim 1, wherein a threshold voltage of the auxiliary switch is smaller than a threshold voltage of the first main switch.

6. The switch circuit of claim 1, wherein the gate drive engine comprises:
a leading edge blanking circuit configured to receive a first PWM signal and blank the leading edge of the first PWM signal to generate a second PWM signal;
a first driver configured to receive the second PWM signal to generate a corresponding gate driving signal for the first main switch; and,
a second driver and a third driver configured to receive the first PWM signal and generate corresponding gate driving signals for the auxiliary switch and the second main switch, respectively.

7. The switch circuit of claim 6, wherein the leading edge blanking circuit comprises a counter that increments periodically.

8. The switch circuit of claim 6, wherein the leading edge blanking circuit comprises a sensing circuit configured to sense a voltage at the switch node and generate the second PWM signal to turn on the first main switch when the sensed voltage is no less than a predetermined voltage value.

9. The switch circuit of claim 1, wherein the gate drive engine comprises:

a delay circuit configured to receive a first PWM signal and generate a predetermined delay on the leading edge of the first PWM signal to generate a third PWM signal;
a first driver configured to receive the third PWM signal to generate a corresponding gate driving signal for the first main switch; and,
a second driver and a third driver configured to receive the first PWM signal and generate corresponding gate driving signals for the auxiliary switch and the second main switch, respectively.

10. The switch circuit of claim 1, wherein the corresponding gate drive signals are configured to turn on the first main switch a fixed predetermined time duration later than turning on the auxiliary switch.

11. The switch circuit of claim 10, wherein the corresponding gate drive signals are configured to turn off the first main switch and the auxiliary switch at the same time.

12. The switch circuit of claim 10, wherein the corresponding gate drive signals are configured to turn off the auxiliary switch earlier than turning off the first main switch.

13. The switch circuit of claim 1, wherein the size of the auxiliary switch is smaller than the size of the first main switch.

14. A method, comprising:
providing a high-side power switch circuit comprising a first main switch, the first main switch having a first terminal, a second terminal, a third terminal;
coupling the second terminal to a first predetermined power supply level;
providing a low-side power switch circuit comprising a second main switch, the second main switch having a fourth terminal, a fifth terminal, and a sixth terminal;
coupling the sixth terminal to a second predetermined power voltage level and coupling and the fifth terminal to the third terminal through a switch node;
coupling an auxiliary switch to the first main switch or the second main switch in direct parallel configuration, wherein an on-resistance of the auxiliary switch is greater than an on-resistance of the first main switch;
configuring the switch node to supply current directly to a load through an inductor such that, in operation, all current through the inductor flows through at least one of: the high-side power switch circuit and the low-side power switch circuit; and,
configuring a gate drive engine to generate binary gate driving signals for the first main switch, the second main switch and the auxiliary switch such that the auxiliary switch is turned on a predetermined time duration earlier than the first main switch and the first main switch, the second main switch and the auxiliary switch operate in a saturated mode.

15. The method of claim 14, further comprising: coupling the auxiliary switch to the first main switch in parallel.

16. The method of claim 14, further comprising: coupling the auxiliary switch to the second main switch in parallel.

17. The method of claim 14, wherein a threshold voltage of the auxiliary switch is smaller than a threshold voltage of the first main switch.

18. The method of claim 14, wherein configuring a gate drive engine comprises:
configuring a leading edge blanking circuit to receive a first PWM signal and blank the leading edge of the first PWM signal to generate a second PWM signal;
configuring a first driver to receive the second PWM signal to generate a corresponding gate driving signal for the first main switch; and, configuring a second driver and a third driver to receive the first PWM signal and generate corresponding gate driving signals for the auxiliary switch and the second main switch, respectively.

19. The method of claim 18, wherein the leading edge blanking circuit comprises a counter that increments periodically.

20. The method of claim 14, wherein configuring a gate drive engine comprises:
- configuring a delay circuit to receive a first PWM signal and generate a predetermined delay on the leading edge of the first PWM signal to generate a third PWM signal;
- configuring a first driver to receive the third PWM signal to generate a corresponding gate driving signal for the first main switch; and,
- configuring a second driver and a third driver to receive the first PWM signal and generate corresponding gate driving signals for the auxiliary switch and the second main switch, respectively.

* * * * *